United States Patent [19]

Tomimatu

[11] Patent Number: 5,856,054
[45] Date of Patent: Jan. 5, 1999

[54] METHOD OF ALIGNMENT IN EXPOSURE STEP THROUGH ARRAY ERROR AND SHOT ERROR DETERMINATIONS

[75] Inventor: Yoshikatu Tomimatu, Hyogo, Japan

[73] Assignee: Mitsubishi Denki Kabushiki Kaisha, Tokyo, Japan

[21] Appl. No.: 783,144

[22] Filed: Jan. 14, 1997

[30] Foreign Application Priority Data

Sep. 3, 1996 [JP] Japan .................................. 8-232984

[51] Int. Cl.⁶ ...................................................... G03F 9/00
[52] U.S. Cl. ................................................................. 430/22
[58] Field of Search ................................................ 430/22

[56] References Cited

U.S. PATENT DOCUMENTS 5,532,091  7/1996  Mizutani ................................... 430/22

FOREIGN PATENT DOCUMENTS 61-44429   3/1986   Japan .
4-306819  10/1992   Japan .
6-349705  12/1994   Japan .

*Primary Examiner*—Christopher G. Young
*Attorney, Agent, or Firm*—McDermott, Will & Emery

[57] ABSTRACT

A method of alignment which can reduce a rotation error and a magnifying rate error of a shot is provided. According to the method of alignment, alignment in the third step (step D) is performed through correction by determining the shot error based on data in X and Y directions in the first step (step B), as well as through correction by determining the array error based on at least one of the data of the alignment marks in X and Y directions in the second step (step C).

4 Claims, 8 Drawing Sheets

CLOCKWISE : POSITIVE
b : AVERAGE   Δb : DISPERSION

ROTATION OF D TO C

ROTATION OF D TO B

ROTATION OF D TO C

ROTATION OF D TO B

ROTATION OF D TO C

ROTATION OF D TO B

ROTATION OF D TO C

ROTATION OF D TO B 5,856,054

1

METHOD OF ALIGNMENT IN EXPOSURE STEP THROUGH ARRAY ERROR AND SHOT ERROR DETERMINATIONS

BACKGROUND OF THE INVENTION

1. Field of the Invention

The present invention relates to a method of alignment, and more particularly relates to a method of alignment for an exposure step in a manufacturing process of a semiconductor device.

2. Description of the Background Art

An exposure apparatus has been known in which a circuit pattern on a photomask or reticle is superimposed on and transferred onto a circuit pattern formed on a semiconductor wafer in a process of manufacturing a semiconductor device. The exposure apparatus is usually referred to as a stepper. The stepper demagnificates a pattern layer formed on the reticle using a projection lens and successively exposes it onto each shot region on one piece of wafer, moving the wafer step by step under the projection lens. FIG. 2 is a flow chart schematically showing an exposure sequence according to the conventional enhanced global alignment (EGA) method. The flow chart is disclosed in Japanese Patent Laying-Open No. 61-44429.

With reference to FIG. 2, according to the alignment method, prealignment of a wafer is first performed using an orientation flat of the wafer (step D10). The entire wafer is thereafter corrected by rotation utilizing wafer global alignment (WGA) marks formed in each shot region (step D11). The WGA mark is an alignment mark for the alignment of the entire wafer.

A wafer stage is then displaced based on a design value of a chip array. In a plurality of shot regions set for detecting an error, positions of laser step alignment (LSA) marks of a pattern printed on the region are detected by an LSA optical system. The LSA alignment mark is for the alignment of the shot in the wafer provided in order to allow finer alignment compared to above mentioned WGA mark.

Position of the wafer stage is detected by a laser interference system simultaneously with the detection of the position of the LSA alignment mark. Based on a detected value, a registration error between the printed pattern on the wafer and the reticle pattern is detected (step D12).

A deviation is determined from the registration error in each shot region and a position coordinate of the wafer stage (coordinate of the printed pattern). An average value of the deviation is determined as a correction value (error parameter) (step D13).

A chip array map in which the error is corrected is formed from the error parameter and the design value (step D14). Six of the error parameters, X offset, Y offset, X scaling, Y scaling, X rotation, and Y rotation, are used. The X offset and the Y offset are respectively amounts of shift in an X axis direction and a Y axis direction in orthogonal XY axes. The X scaling and the Y scaling are amounts of shift due to expansion and contraction in the X axis direction and the Y axis direction, respectively. The X rotation and the Y rotation are amounts of shift due to rotation of the X axis and the Y axis, respectively. The position of the wafer stage is determined by the step and repeat approach according to the chip array map formed from the error parameters and the design value (step D15). Each shot region is thereafter exposed (step D16).

The alignment has conventionally been conducted using the six error parameters as described above. In order to make the conventional method more precise, a method of correction using additional error parameters is proposed.

According to the proposed method, a shot rotation error and a shot magnifying rate error, that are error parameters in the shot region, are further utilized in addition to the above described six error parameters. FIG. 3 is a schematic diagram showing a positioning procedure (alignment sequence) according to the proposed method. With reference to FIG. 3, according to this method, alignment in a step B is performed based on step A, and alignment in a step C is performed based on the step B. Alignment in a step D is carried out based on an alignment mark in the X axis direction in the step B, as well as an alignment mark in the Y axis direction in the step C. At the time of alignment for respective steps B, C, and D, the alignment is achieved by determining a correction value using the six error parameters (array error) and the rotation and magnifying rate errors of the shot (shot errors).

A problem in the method of alignment shown in FIG. 3 is difficulty in making the correction of the shot error properly. More specifically, although the array error can be corrected independently in the X and Y axes directions, independent correction of the shot rotation error and the magnifying rate error is impossible since the errors in the X and Y axes directions are related to each other. A problem when the alignment marks in the X axis direction and the Y axis direction are superimposed on corresponding marks in separate steps as the case of the step D, is that shift of the position is increased if correction is made using the shot rotation error and magnifying rate error. This is further described with reference to FIGS. 4–19.

FIGS. 4–19 show the rotation error only. Referring to FIG. 4, a representative rotation error in a shot is described. The shot rotation error is constituted by the sum of a constant error (b) and a dispersive error (Δb). In this case, the constant error (b) is considered a fixed value, so that the range of the shot rotation error is b±Δb.

FIG. 5 is a systematic diagram showing a pattern in which a shot rotation error is generated in the steps B, C and D steps shown in FIG. 3. With reference to FIG. 5, the maximum error at the time of alignment performed in the step C with respect to the step B is b+Δb (in the case of $\hat{2}$), and the minimum error is b−Δb (in the case of $\hat{1}$). When the alignment in the step D is performed for the maximum error $\hat{2}$ and the minimum error $\hat{1}$ respectively, further maximum errors ($\hat{1}$–2, $\hat{2}$–2) as well as further minimum errors ($\hat{1}$–1, $\hat{2}$–1) are generated respectively for the cases of $\hat{1}$ and $\hat{2}$. FIG. 6 shows the case of $\hat{1}$ in FIG. 5, FIGS. 7–9 show the case of $\hat{1}$–1 in FIG. 5, FIGS. 10–12 show the case of $\hat{1}$–2 in FIG. 5, FIG. 13 shows the case of $\hat{2}$ in FIG. 5, FIGS. 14–16 show the case of $\hat{2}$–1 in FIG. 5, and FIGS. 17–19 show the case of $\hat{2}$–2 in FIG. 5. When the alignment in the step D is performed, the step D is usually performed between the steps B and C.

With reference to FIG. 6, in the case of $\hat{1}$ shown in FIG. 5, the error in the step C with respect to the step B is b−Δb. The alignment in the step D is desirably performed between the steps B and C. In this case, if the rotation error in the step D with respect to the step C is α, and the rotation error in the step D with respect to the step B is β, α and β are expressed by following expressions (1) and (2). Here, b>0, b>Δb, and the clockwise direction from D is assumed to be positive.

$$\alpha = (-1)(b - \Delta b)/2 \tag{1}$$

$$\beta = (b - \Delta b)/2 \tag{2}$$

With reference to FIGS. 7–9 next, $|\alpha|$, $|\beta|$, $|\gamma|$, $|\omega_c|$, $\omega_c$, $|\omega_b|$, and $\omega_b$ are respectively expressed by the following expressions (3)–(9).

$$|\alpha|=(b-\Delta b)/2 \tag{3}$$

$$|\beta|=(b-\Delta b)/2 \tag{4}$$

$$|\gamma|=b-\Delta b \tag{5}$$

$$\begin{aligned}|\omega_c| &= |\gamma|-|\alpha| \\ &= b-\Delta b-(b-\Delta b)/2 \\ &= (b-\Delta b)/2\end{aligned} \tag{6}$$

Since D is in a counterclockwise direction with respect to C as shown in FIG. 7, following expressions are derived.

$$\omega_c=-(b-\Delta b)/2 \tag{7}$$

$$\begin{aligned}|\omega_b| &= |\gamma|+|\beta| \\ &= b-\Delta b+(b-\Delta b)/2 \\ &= (b-\Delta b)3/2\end{aligned} \tag{8}$$

$$\omega_b=-(b-\Delta b)3/2 \tag{9}$$

Referring to FIGS. 10–12 next, $|\alpha|$, $|\beta|$, $|\gamma|$, $|\omega_c|$, $\omega_c$, $|\omega_b|$, and $\omega_b$ in the case of $\hat{1}$-2 in FIG. 5 are respectively expressed in the following expressions (10)–(16).

$$|\alpha|=(b-\Delta b)/2 \tag{10}$$

$$|\beta|=(b-\Delta b)/2 \tag{11}$$

$$|\gamma|=b+\Delta b \tag{12}$$

$$\begin{aligned}|\omega_c| &= |\gamma|+|\alpha| \\ &= b+\Delta b+(b-\Delta b)/2 \\ &= 3b/2+1\Delta b/2\end{aligned} \tag{13}$$

As shown in FIG. 11, D is in the counterclockwise direction with respect to C, following expressions are derived.

$$\omega_c=|\omega_c| \tag{14}$$

$$\begin{aligned}|\omega_b| &= |\gamma|-|\beta| \\ &= b+\Delta b-(b-\Delta b)/2 \\ &= 1b/2+3\Delta b/2\end{aligned} \tag{15}$$

$$\omega_b=|\omega_b| \tag{16}$$

With reference to FIG. 13, in the case of $\hat{2}(b+\Delta b)$ in FIG. 5, error in the step C with respect to the step B is $b+\Delta b$. In this case, the alignment in the step D is desirably performed between the step B and the step C. Assuming the rotation error in the step D with respect to the step B is a, and the rotation error in the step D with respect to the step C is $\beta$, $\alpha$ and $\beta$ are expressed by the following expressions (17) and (18).

$$\alpha=(-1)\,(b+\Delta b)/2 \tag{17}$$

$$\beta=(b+\Delta b)/2 \tag{18}$$

Next with reference to FIGS. 14–16, $|\alpha|$, $|\beta|$, $|\gamma|$, $|\omega_c|$, $\omega_c$, $|\omega_b|$, and $\omega_b$ in the case of $\hat{2}$-1 in FIG. 5 are respectively expressed by the following equations (19) to (25).

$$|\alpha|=(b+\Delta b)/2 \tag{19}$$

$$|\beta|=(b+\Delta b)/2 \tag{20}$$

$$|\gamma|=b-\Delta b \tag{21}$$

$$\begin{aligned}|\omega_c| &= |\gamma|+|\beta| \\ &= b-\Delta b+(b+\Delta b)/2 \\ &= 3b/2-1\Delta b/2\end{aligned} \tag{22}$$

As shown in FIG. 15, D is in the counterclockwise direction with respect to C, so that the following equations are derived.

$$\omega_c=-(3b/2-1\Delta b/2) \tag{23}$$

$$\begin{aligned}|\omega_b| &= |\gamma|-|\alpha| \\ &= b-\Delta b-(b+\Delta b)/2 \\ &= 1b/2-3\Delta b/2\end{aligned} \tag{24}$$

$$\omega_b=-(1b/2-3\Delta b/2) \tag{25}$$

Referring to FIGS. 17–19, $|\alpha|$, $|\beta|$, $|\gamma|$, $|\omega_c|$, $\omega_c$, $|\omega_b|$, and $\omega_b$ in the case of $\hat{2}$-2 in FIG. 5 are respectively expressed by the following equations (26) to (32).

$$|\alpha|=(b+\Delta b)/2 \tag{26}$$

$$|\beta|=(b+\Delta b)/2 \tag{27}$$

$$|\gamma|=b+\Delta b \tag{28}$$

$$\begin{aligned}|\omega_c| &= |\gamma|-|\beta| \\ &= b+\Delta b-(b+\Delta b)/2 \\ &= (b+\Delta b)/2\end{aligned} \tag{29}$$

As shown in FIG. 18, since D is in the clockwise direction with respect to C, following equations are derived.

$$\omega_c=|\omega_c| \tag{30}$$

$$\begin{aligned}|\omega_b| &= |\gamma|+|\alpha| \\ &= b+\Delta b+(b+\Delta b)/2 \\ &= (b+\Delta b)3/2\end{aligned} \tag{31}$$

$$\omega_b=|\omega_b| \tag{32}$$

Referring to above expressions (1) to (32), there are four patterns of the shot rotation error ($\omega_c$, $\omega_b$) in the case of $\hat{1}$-1, $\hat{1}$-2 in FIG. 5, according to the expressions (7), (9), (14) and (16), that is, $-(b-\Delta b)/2$, $-(b-\Delta b)3/2$, $3b/2+1\Delta b/2$ and $1b/2+3\Delta b/2$. There are also four patterns of the shot rotation error ($\omega_c$, $\omega_b$) in the case of $\hat{2}$-1, $\hat{2}$-2 in FIG. 5, according to the expressions (23), (25), (30) and (32), that is, $-(3b/2-1\Delta b/2)$, $-(1b/2-3\Delta b/2)$, $(b+\Delta b)/2$, and $(b+\Delta b)3/2$.

The maximum absolute value of the amounts of error in above eight expressions is $(b+\Delta b)3/2$ derived from the expression (32).

On the other hand, as for errors generated when the shot is not corrected by rotation, the maximum error in the step C with respect to the step B is $\Delta b$, and the maximum error in the step D with respect to the step B is $\Delta b$ assuming that the constant error b is 0 in FIG. 5. As a result, the maximum error in the step D with respect to the step B becomes $2\cdot\Delta b$. The value of the dispersive error ($\Delta b$) and the average value of the errors (b) are usually at the same level, and as a result of comparison between $(b+\Delta b)3/2$ and $2\cdot\Delta b$, $2\cdot\Delta b$ is smaller than $(b+\Delta b)3/2$ by $3/2b-1/2\Delta b$. This result indicates that the error is increased by $3/2b-1/2\Delta b$ in the case of the expression (32) in FIG. 19 compared with the case in which the shot is not corrected by rotation.

As described above, when the alignment in the step D is performed using data from separate steps regarding the X axis direction and the Y axis direction as shown in FIG. 3, the error is disadvantageously increased if the shot is corrected by rotation, compared with the case in which the shot is not corrected by rotation.

SUMMARY OF THE INVENTION

One object of the present invention is to provide a method of alignment in which alignment accuracy can be improved compared with the conventional method.

Another object of the present invention is to provide a method of alignment in which a rotation error and a magnifying rate error of a shot can be reduced.

A method of alignment according to one aspect of the present invention includes first, second, and third steps. In the first step, first alignment marks arranged respectively in X axis direction and Y axis direction in orthogonal XY axes are formed. In the second step, second alignment marks respectively arranged in X and Y axes directions are formed after the first step. The third step is performed after the second step. The alignment in the second step is conducted through correction by determining an array error and a shot error based on the first alignment marks in both of the X and Y directions formed in the first step described above. The alignment in the third step is performed through correction by determining the shot error based on the first alignment marks in both of X and Y directions formed in the first step, and correction by determining the array error based on the second alignment mark in at least one direction among the second alignment marks in the X and Y axes directions formed in the second step. According to the present invention, at the time of the alignment in the third step, the array error is corrected based on the data regarding the second alignment marks in at least one of the X and Y axes directions in the second step, while the shot error is corrected based on the data regarding the first alignment marks in the X and Y axes directions. As a result, the shot error can be corrected based on the alignment marks in the X and Y directions in the same step. The shot error can be more effectively reduced compared to the case in which the shot error is corrected based on different data with respect to the X direction and the Y direction.

In the method of alignment according to the one aspect of the present invention, the array error may be corrected in the third step based on the first alignment mark in one of the X and Y axes directions formed in the first step, and the second alignment mark in a direction different from above one direction out of the second alignment marks in the X and Y axes directions formed in the second step. In this case, a fourth step of forming alignment marks in the X axis direction and the Y axis direction prior to the first step may further be included. The alignment in the first step may be performed by correcting the array error and the shot error based on the alignment marks in the X and Y axes directions formed in the fourth step.

In the method of alignment according to the one aspect of the invention, the array error may be corrected in the third step based on the second alignment marks in the X and Y axes directions formed in the second step.

In the method of alignment according to the one aspect of the invention, the array error may include an X offset error, a Y offset error, an X expansion and contraction error, a Y expansion and contraction error, an X rotation error and a Y rotation error, and the shot error may include a shot rotation error and a magnifying rate error. In this case, the X offset error is shift in the X axis direction in the orthogonal XY axes and the Y offset error is shift in the Y axis direction. The X expansion and contraction error is shift due to the expansion and contraction in the X axis direction, and the Y expansion and contraction error is shift due to the expansion and contraction in the Y axis direction. The X rotation error is shift due to the rotation of the X axis, and the Y rotation error is shift due to the rotation of the Y axis. The X expansion and contraction error and the Y expansion and contraction error respectively correspond to the X scaling and the Y scaling in the embodiment of the present invention. The X rotation error and the Y rotation error respectively correspond to the X rotation and the Y rotation shown in the embodiment of the invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiment of the present invention is hereinafter described following the attached drawings.

Figure 1:
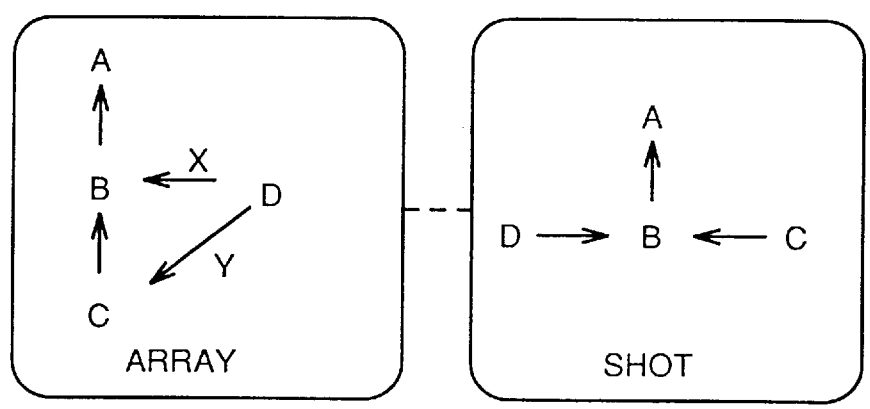
FIG. 1 is a schematic view illustrating the method of alignment according to one embodiment of the present invention.
Figure 2:
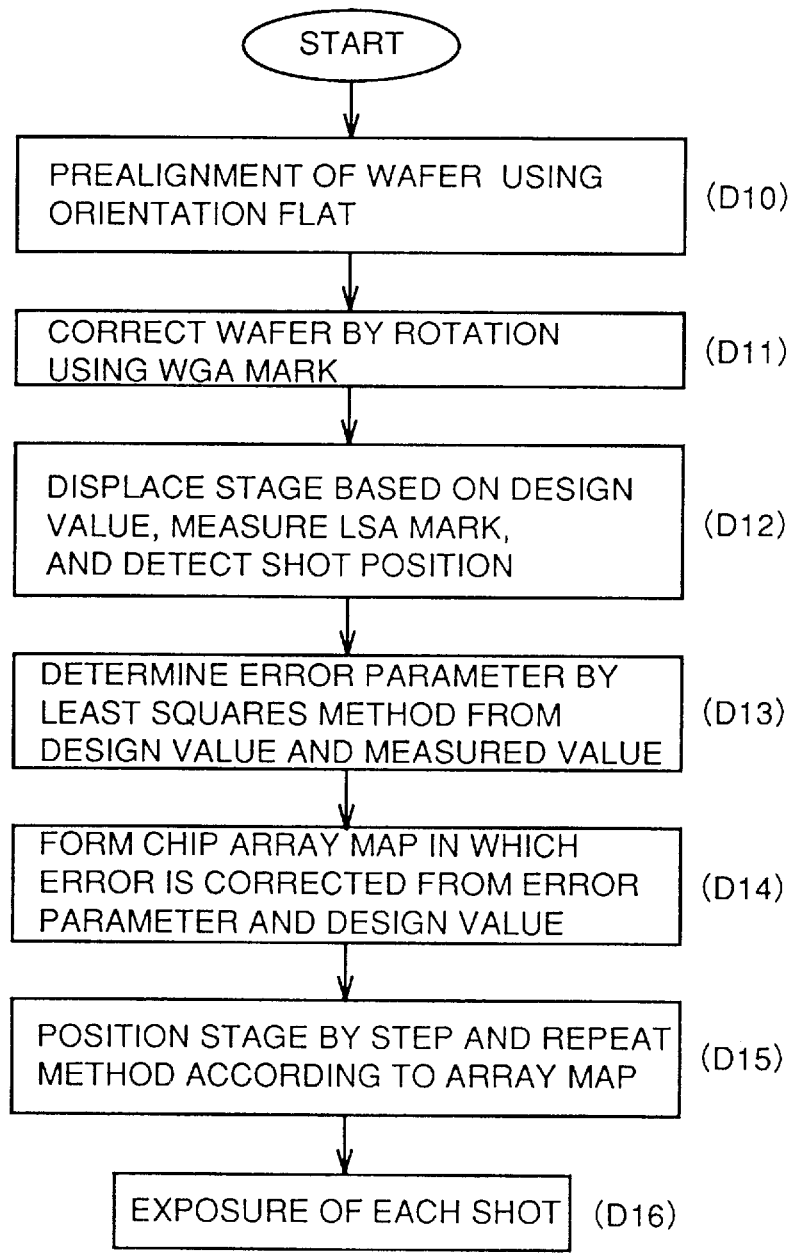
FIG. 2 is a flow chart showing the conventional method of alignment.

According to the embodiment, data for making correction of an array error is different from data for correcting a shot error as shown in FIG. 1. More specifically, the alignment in the step B is performed through correction by determining the array error based on data of alignment marks with respect to the X and Y axes directions in the step A. The alignment in the step C is performed through correction by determining the array error based on data of alignment marks with respect to the X and Y axes directions in the step B. The alignment in the step D is performed through correction by determining the array error based on data of the alignment mark with respect to the X axis direction in the step B and the data of the alignment mark with respect to the Y axis direction in the step C. On the other hand, corrections of the shot error in the steps B and C are made similar to the correction of the array error. Correction of the shot error at the time of the alignment in the step D is performed, different from the correction of the array error, through correction by determining the shot error based on the data of the alignment marks in the X and Y axes directions in the step B.

Figure 3:
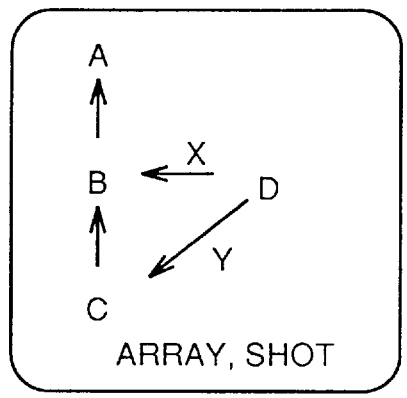
FIG. 3 is a schematic view showing the conventional improved method of alignment.
Figure 4:
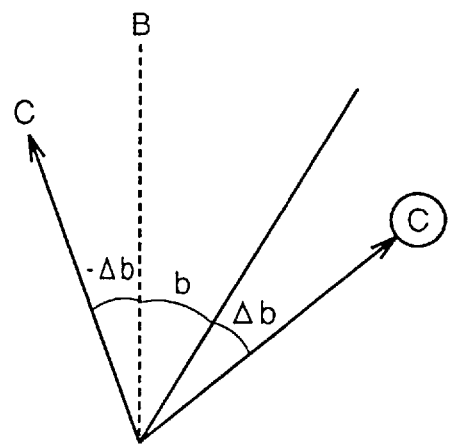
FIG. 4 is an illustration showing a concept of the representative rotation error in the conventional method of alignment.
Figure 5:
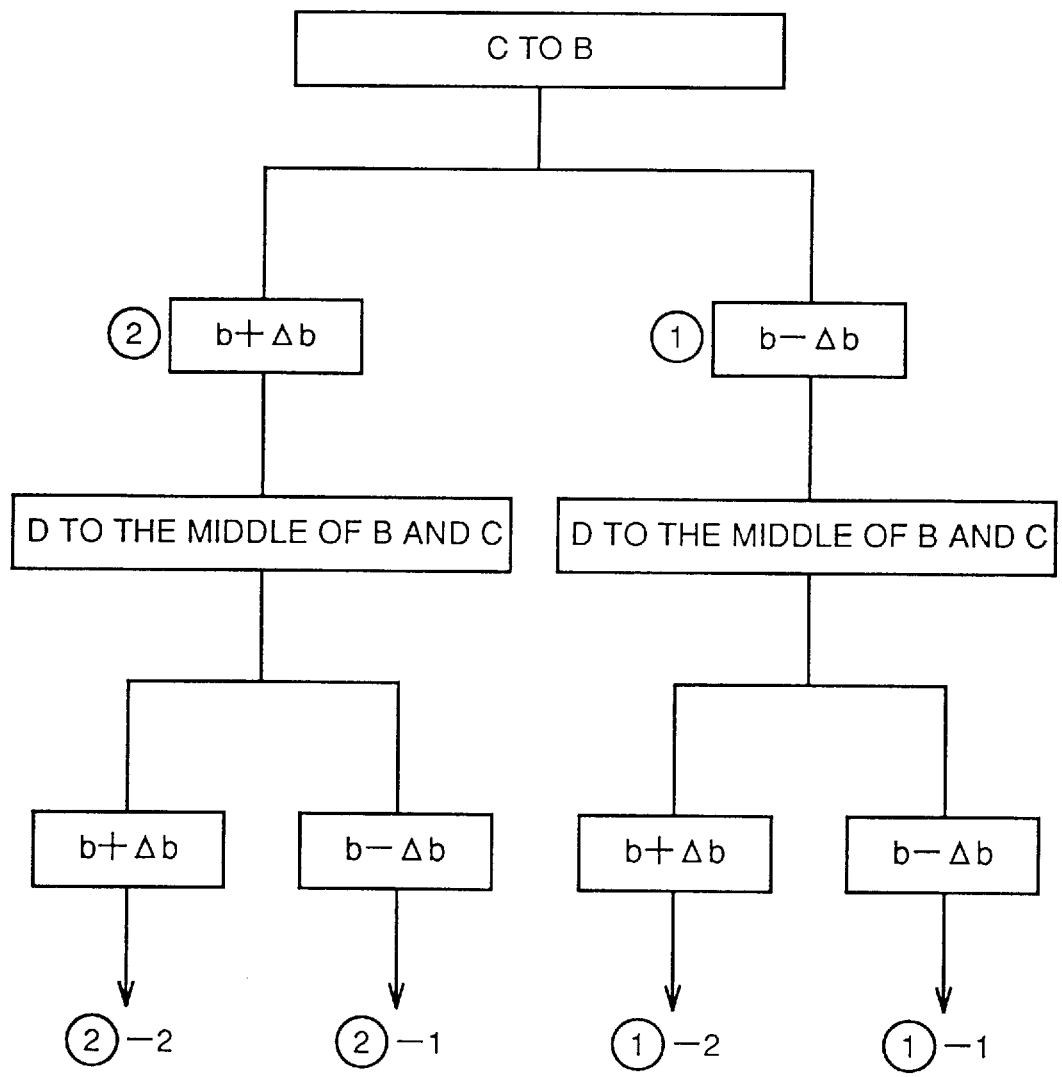
FIG. 5 is a schematic view for describing the representative rotation error generated in the conventional method of alignment shown in FIG. 3.
Figure 6:
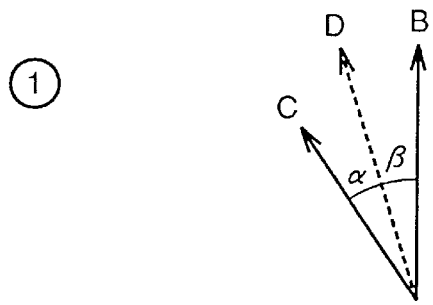
FIG. 6 is a schematic diagram showing the rotation error in the case of $\hat{1}$ shown in FIG. 5.
Figure 7:
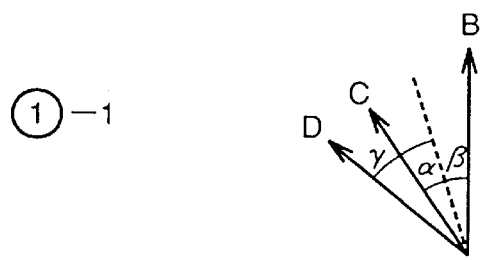
FIGS. 7–9 are schematic diagrams showing the rotation error in the case of $\hat{1}$–1 shown in FIG. 5.
Figure 8:
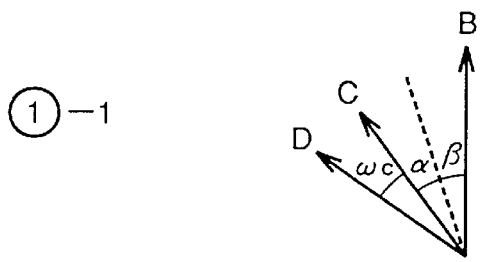
Figure 9:
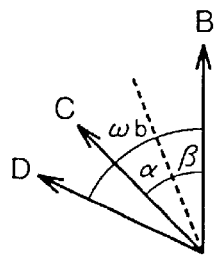
Figure 10:
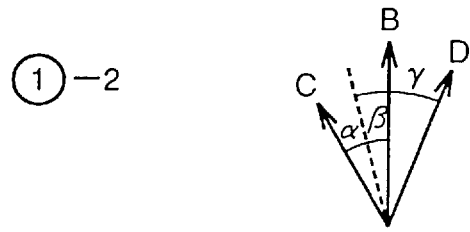
FIGS. 10–12 are schematic diagrams showing the rotation error in the case of $\hat{1}$–2 in FIG. 5.
Figure 11:
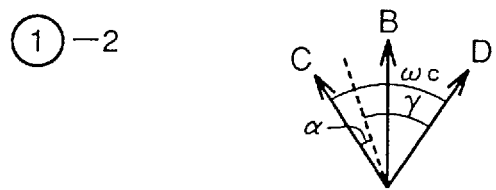
Figure 12:
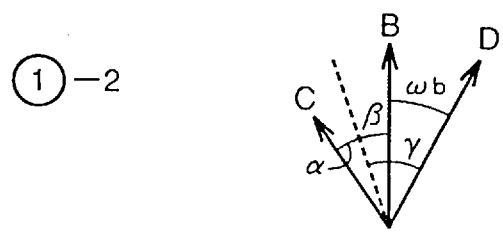
Figure 13:
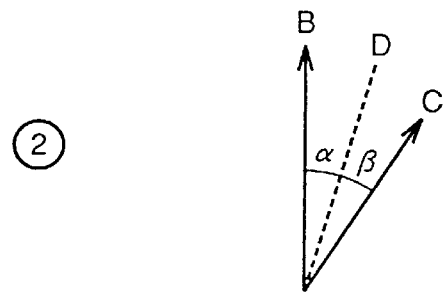
FIG. 13 is a schematic diagram showing the rotation error in the case of $\hat{2}$ shown in FIG. 5.
Figure 14:
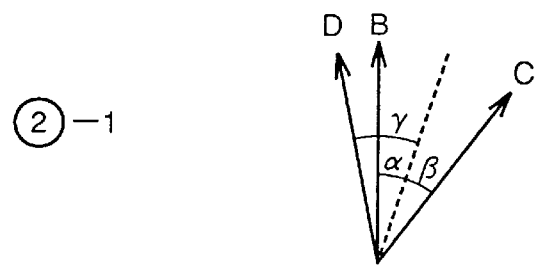
FIGS. 14–16 are schematic diagrams showing the rotation error in the case of $\hat{1}$–1 shown in FIG. 5.
Figure 15:
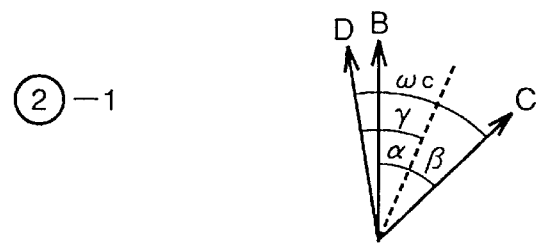
Figure 16:
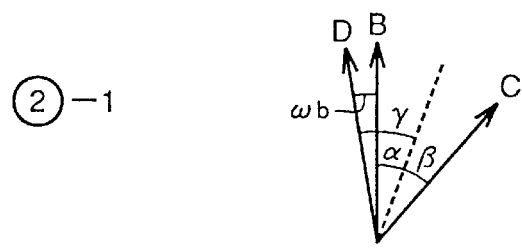
Figure 17:
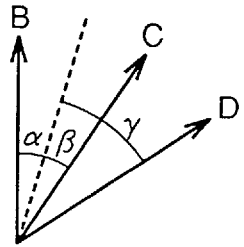
FIGS. 17–19 are schematic diagrams showing the rotation error in the case of $\hat{2}$–2 shown in FIG. 5.
Figure 18:
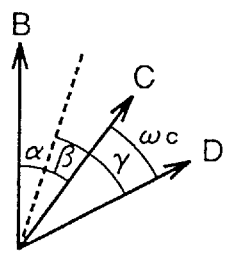
Figure 19:
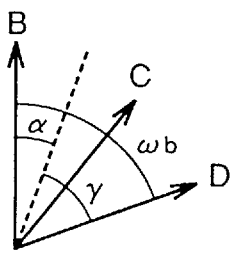

According to the embodiment shown in FIG. 1, the correction of the shot error for the alignment in the step C, as well as the correction of the shot error for the alignment in the step D are both carried out based on the data regarding the alignment marks in the X and Y axes directions in the step B. Accordingly, the shot error (shot rotation error and magnifying rate error) can be corrected using the data regarding the alignment marks in the X and Y axes directions in the same step. The shot error can thus be properly corrected different from the case in which the data with respect to the X and Y axes directions are provided from separate steps. Compared with the method of alignment shown in FIG. 3, alignment accuracy can be improved since the accuracy of the correction of the shot error according to the conventional method can be improved.

Detailed description concerning the method of correction is hereinafter given. Six parameters of the array error, X offset, Y offset, X scaling, Y scaling, X rotation, and Y rotation are used. Correction values ΔX and ΔY are calculated from the following expressions (33) and (34) using these six error parameters.

$$\Delta X = X \text{ offset} + X \text{ coordinate} \cdot X \text{ scaling} + X \text{ coordinate} \cdot X \text{ rotation} \quad (33)$$

$$\Delta Y = Y \text{ offset} + Y \text{ coordinate} \cdot Y \text{ scaling} + Y \text{ coordinate} \cdot Y \text{ rotation} \quad (34)$$

According to above expressions (33) and (34), correction values of the array error (ΔX and ΔY) are determined, and correction values of the shot rotation error and the shot magnifying rate error are determined using an average value of the data regarding the alignment marks in the X axis and the Y axis directions. After calculating the correction values of the array error and the shot error for the step A, a pattern for the step B is superimposed on the pattern for the step A using the calculated correction values.

Amount of shift is then determined by measuring the alignment marks formed in the step B as determined in the step A. Based on the amount of shift, correction values of the array error (ΔX, ΔY), as well as correction values of the shot error for the step B are calculated. Superimposing a pattern for the step C on a pattern for the step B based on the correction values, exposure is conducted.

The pattern for the step D is superimposed regarding the X axis direction, based on the alignment mark with respect to the X axis direction in the step B, and regarding the Y axis direction based on the alignment mark with respect to the Y axis direction in the step C.

When the array error is corrected for the alignment in the step D, the correction value used with respect to the X axis direction is based on the data of the alignment mark in the step B, and the correction value used with respect to the Y axis direction is based on the data of the alignment mark in the step C. As the correction value of the shot error at the time of the alignment in the step D, correction values obtained from the data of the alignment marks in the step B are used both for X and Y axes directions. Accordingly, correction values for the array error and the shot error can be more accurately determined, so that alignment accuracy in the step D can be improved compared with the conventional method. According to the method of alignment in this embodiment, if the range of the shot rotation error is b±Δb, constant error (b) becomes 0 through the correction described above. The maximum shot error in the step C for the step B, as well as the maximum shot error in the step D for the step B are both Δb. As a result, the maximum shot error in the step D for the step C is 2Δb, which is the maximum error according to the method in this embodiment. The error is decreased by 3b/2−1Δb/2 in this embodiment compared with the conventional method described following FIGS. 5–19 in which the error is maximum, that is, (Δb+b)3/2. Constant error (b) and dispersive error (Δb) are actually at almost the same level, so that if b Δb, 3b/2−1Δb/2=b is obtained. According to the embodiment of the present invention, alignment accuracy is improved by the amount of constant error (b), compared with the conventional method of alignment described referring to FIGS. 5–19. Generally, b is approximately 0.01 μm to 0.02 μm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a sequential process of forming layers on a substrate, a method of alignment, comprising the steps of:

a first step of forming a first patterned layer on said substrate, said first patterned layer having first alignment marks respectively arranged in X and Y directions in orthogonal XY axes;

a second step of forming a second patterned layer aligned on said first patterned layer, said second patterned layer having second alignment marks respectively arranged in said X and Y axes directions, said second step comprising determining an array error and a shot error based on the first alignment marks; and a third step of forming a third patterned layer aligned on said second patterned layer, said third step comprising calculating shot error based on the first alignment marks in both of said X and Y directions formed in said first step, and calculating array error based on at least one direction of the second alignment marks in said X and Y axes directions formed in said second step.

2. The method of alignment according to claim 1, wherein said step of calculating array error in said third step is further based on a first alignment mark formed in said first step which is in an axis direction different from said at least one direction.

3. The method of alignment according to claim 1, wherein said step of calculating the array error in said third step is based on the second alignment marks in the X and Y axes directions formed in said second step.

4. The method of alignment according to claim 1, wherein said array error comprises:

an X offset error which is a shift in said X axis direction;

a Y offset error which is a shift in said Y axis direction;

an X expansion and contraction error which is a shift due to expansion and contraction in said X axis direction;

a Y expansion and contraction error which is a shift due to expansion and contraction in said Y axis direction;

an X rotation error which is a shift due to rotation of said axis; and a Y rotation error which is a shift due to rotation of said Y axis, and wherein said shot error includes a shot rotation error and a magnifying rate error.

* * * * *